(12) United States Patent
Ichimaru

(10) Patent No.: US 6,356,159 B1
(45) Date of Patent: Mar. 12, 2002

(54) PLL FREQUENCY SYNTHESIZER WITH RIPPLE CURRENT COMPENSATING CIRCUIT

(75) Inventor: Kouzou Ichimaru, Ohita Ken (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/620,740

(22) Filed: Jul. 20, 2000

(30) Foreign Application Priority Data

Jul. 23, 1999 (JP) .......................................... 11-208488

(51) Int. Cl.$^7$ .............................................. H03L 7/197
(52) U.S. Cl. .............................. 331/16; 331/17; 331/25; 331/10
(58) Field of Search .............................. 331/16, 17, 25, 331/10, 11

(56) References Cited

U.S. PATENT DOCUMENTS 4,686,488 A * 8/1987 Attenborough ................. 331/2
6,130,925 A * 10/2000 Ishimaru et al. ............. 329/325
6,141,394 A * 10/2000 Linebarger et al. ......... 375/376

* cited by examiner

Primary Examiner—Siegfried H. Grimm
(74) Attorney, Agent, or Firm—William B. Kempler; Frederick J. Telecky, Jr.

(57) ABSTRACT

A frequency synthesizer that can accurately compensate for ripple current. The frequency synthesizer 1 having a PLL loop containing an oscillator 31 and a charge pump circuit 35 has a detector circuit 40 and a delay circuit 39. The detector circuit 40, by detecting a ripple current with a superimposed compensating current, detects the time difference between the output time of the compensating current and the output time of the ripple current, and since the delay circuit 39 delays one or both of the output time of the compensating current and the output time of the ripple current based on that detection result, the time difference for the output times can be made small, and if a compensating current is supplied that is equal to the ripple current, it becomes possible to accurately remove the ripple current.

4 Claims, 4 Drawing Sheets

PLL FREQUENCY SYNTHESIZER WITH RIPPLE CURRENT COMPENSATING CIRCUIT

FIELD OF THE INVENTION

The present invention relates to the technical field of frequency synthesizers, and in particular, it relates to a frequency synthesizer that can accurately compensate for ripple current.

BACKGROUND OF THE INVENTION

The cellular telephone is a multi-frequency channel access system, and in order to shift the frequency being used for an open channel, a frequency synthesizer that can provide high-speed lock up is necessary.

The encoder 101 of FIG. 6 is a conventional device of this type of frequency synthesizer, and a PLL (phase-locked loop) circuit is used for the frequency divider system.

This frequency synthesizer 101 is provided within a semiconductor integrated circuit device that forms a transmit/receive circuit for a cellular telephone, and it has an oscillator 131, a frequency divider 132, a reference clock signal generator 133, a phase comparator 134, a charge pump circuit 135, a low-pass filter 136, and a control circuit 138. Within the oscillator 131, an external output signal (OUT) of a prescribed frequency is generated, and that external output signal (OUT) is output to the frequency divider 132 and to other circuits within the semiconductor integrated circuit device in which this frequency synthesizer 101 is provided.

The frequency divider 132 frequency divides the external output signal (OUT) that is input, generates a comparison signal, and outputs this comparison signal to the phase comparator 134. The said phase comparator 134 compares the phase of the comparison signal that is input from the frequency divider 132 and a reference clock signal that is input from the reference clock signal generator 133, and outputs a signal corresponding to the phase difference to the charge pump circuit 135. The charge pump circuit 135, based on the signal corresponding to the input phase difference, supplies an output signal, and that output signal is output to the oscillator 131 as a control signal via the low-pass filter 136.

The oscillator 131 changes the frequency of the external output signal (OUT) by means of this input control signal, and it is controlled so that the phase of the comparison signal matches the phase of the reference clock signal. As a result, the frequency of the external output signal (OUT) becomes the value of the frequency of the reference clock signal multiplied by the divisor value of the frequency divider 132.

The above-mentioned frequency divider 132 is controlled by means of the control circuit 138, and it is constructed so that the divisor value changes cyclically, for example, for the case where the frequency of the reference clock signal is 200 KHz, the value for seven cycles (35 μsec) is 5000, and the value for one cycle (5 μsec) is 5001, the average divisor value in which eight cycles are averaged becomes 5000.125 (=5000+⅛). Therefore, the frequency of the external output signal (OUT) is locked at the average divisor value multiplied by the reference clock signal, which is 1000025 KHz.

During eight cycles, if the divisor value for six cycles is 4000, and the divisor value for two cycles is 4001, the average divisor value is 4000.25, and the frequency of the external output signal (OUT) becomes 800.050 MHz.

In this way, if the average divisor value has values in columns to the right of the decimal point, narrow channel spacings of 25 KHz, 12.5 KHz, and the like, become possible for high frequencies such as 800 MHz and 1 GHz.

However, if the divisor value is cyclically changed as mentioned above, even after the external output signal (OUT) is locked at the desired frequency, the phase of the comparison signal and the phase of the reference clock signal are not completely synchronized, and a phase difference is generated. This phase difference is the cause of a cyclically changing ripple current within the signal that is output from the phase comparator 134.

The ripple current within the signal output from the phase comparator 134 causes the generation of transient components in the external output signal (OUT), which not only deteriorates reception characteristics of communications equipment such as cellular telephones, but it is also a source of interference during transmission, so ripple current is an enormous problem.

Thus, the compensating circuit 137 is provided in the above-mentioned frequency synthesizer 101. Within the compensating circuit 137, the amount of compensating current is set beforehand, and when a control signal from the control circuit 138 is input to the compensating circuit 137, a compensating current of the predetermined current amount is superimposed on the output signal of the charge pump circuit 135 at the timing at which that control signal is input, so that the ripple current can be removed, and so that an external output signal (OUT) without any transient components can be output.

The waveform of the ripple current and the compensating current contained in the output signal of the charge pump circuit 135 are respectively shown as symbols (a, b) in FIG. 7. The ripple current (a) changes cyclically as shown in FIG. 7, and the compensating current (b) also changes cyclically so as to follow the changes of the ripple current (a).

At this time, even if a compensating current (b) is generated that is equal to the size of the ripple current (a), if the generation time of the ripple current and the output time of the compensating current are not synchronized, as shown by symbol (c) in FIG. 7, the ripple component of the output signal of the charge pump circuit on which the compensating current is superimposed does not become zero, and there is the problem that the transient component cannot be removed accurately.

The present invention was created for the purpose of solving the unfavorable circumstances of the above-mentioned prior art, and its purpose is to offer technology which can accurately compensate for ripple current.

SUMMARY OF THE INVENTION

In order to solve the above-mentioned problems, the present invention has an oscillator that controls the frequency of an output signal according to a voltage control signal, a frequency divider that divides the above-mentioned output signal according to a frequency division value that changes cyclically and generates a comparison signal, a phase comparator that generates a phase difference signal by comparing the phase of the above-mentioned comparison signal and the phase of a reference clock signal, a delay circuit that generates and applies a delay to the above-mentioned phase difference signal, a charge pump circuit that generates a control signal corresponding to the phase difference signal that is output from the above-mentioned delay circuit, a low-pass filter that executes a prescribed wave filtering process on the above-mentioned control signal and outputs a voltage control signal, a compensating circuit that superimposes a compensating current on the above-mentioned control signal according to compensation voltage data, a detecting circuit that detects the output time of the above-mentioned control signal from the above-mentioned voltage control signal and the output time of the above-mentioned compensating current, and outputs a detection signal, wherein the above-mentioned delay circuit controls the supply of the above-mentioned compensating voltage data to the above-mentioned compensating circuit so that the output time of the above-mentioned control signal and the output time of the above-mentioned compensating current are synchronized.

One aspect of the present invention is based on the frequency synthesizer in which the detecting circuit, within one cycle at the time of the above-mentioned cyclic frequency divider, detects the time difference between the output time of the above-mentioned control signal and the output time of the above-mentioned compensating current by means of the above-mentioned voltage control signal that contains the above-mentioned superimposed compensating current and that is output at two times that bracket the times when the ripple current is at a maximum and a minimum.

The present invention constructed as described above has a detector circuit and a delay circuit, wherein the time difference between the output time for the output signal (control signal) of the charge pump circuit and the output time for the compensated current is detected by the detector circuit, and based on the detection results, one or both of the output time of the output signal and the output time of the compensating circuit are delayed by the delay circuit.

Therefore, for example, if the output signal is ahead of the compensating current, the timing for the output signal can be delayed by delaying the output time of the output signal by means of the delay circuit, and conversely, if the output signal lags behind the compensating current, since the timing for the compensating circuit can be delayed by delaying the output time of the compensating voltage data by means of the delay circuit, the time difference between the output time of the compensating current and the output time of the output signal can be corrected so that it is reduced.

In this way, the time difference between the output times is detected by the detecting circuit, the output time of the output signal for the compensating current is delayed, and after the output times of the output signal and the compensating current are corrected so that the time difference between the output times is small, in a condition in which the compensating current is output at the corrected output time, the time difference between the output times is detected again, the output time of the output signal for the compensating current is delayed, and the time difference between the output times is again corrected. If this type of operation is repeated a number of times, since the output times for the output signal and the compensating current can eventually be synchronized, it becomes possible to accurately remove the transient components.

In the present invention, output times where the compensating current brackets the times that the ripple current becomes a maximum and a minimum are detected twice by the detecting circuit.

After the ripple current has increased from minimum to maximum over one cycle of the frequency divider, it again decreases towards the minimum, and the compensating current, after decreasing from maximum to minimum, is output so as to again increase towards the maximum.

At this time, if the output time of the compensating current and the output time of the ripple current are synchronized, the output signal with the superimposed compensating current becomes 0, but if at first the output timing for the compensating current is delayed more than the output timing for the ripple current, since the absolute value of the compensating current is larger than the absolute value of the ripple current, the output signal with the superimposed compensating current becomes negative. After the ripple current becomes a maximum, since the absolute value of the ripple current becomes larger than the absolute value of the compensating current, the output signal with the superimposed compensating current becomes positive. Therefore, in this case, the output signal with the superimposed compensating current changes polarity from negative to positive at the times where the ripple current becomes a maximum.

Conversely, if the compensating current is ahead of the ripple current, the polarity of the output signal with the superimposed compensating current changes from positive to negative at the times where the ripple current becomes a maximum.

Therefore, if the polarity of the output signal with the superimposed compensating current is detected at two times that bracket the times when the ripple current becomes a maximum, it can be determined which of the output times is ahead of the other, and based on that detection result, one of either the compensating current or the ripple current is delayed by the delay circuit, and control can be performed so as to synchronize the output time of the compensating current at the output time of the ripple current.

Therefore, the output signal with the superimposed compensating current is detected, and the detection as to whether or not the ripple current has become 0 allows the detection of whether or not there is a time difference between the output time of the compensating current and the output time of the ripple current.

REFERENCE NUMERALS AS SHOWN IN THE DRAWINGS

In the figures, 1 is a frequency synthesizer, 31 is an oscillator, 32 is a frequency divider, 34 is a phase comparator, 35 is a charge pump circuit, 36 is a low-pass filter, 37 is a compensating circuit, 38 is a frequency divider control circuit, 39 is a delay circuit, 40 is a detector circuit, 43 is a first delay section, and 44 is a second delay section.

DESCRIPTION OF THE EMBODIMENTS

Below, an explanation is given in regard to embodiments of the present invention with reference to the figures.

Figure 1:
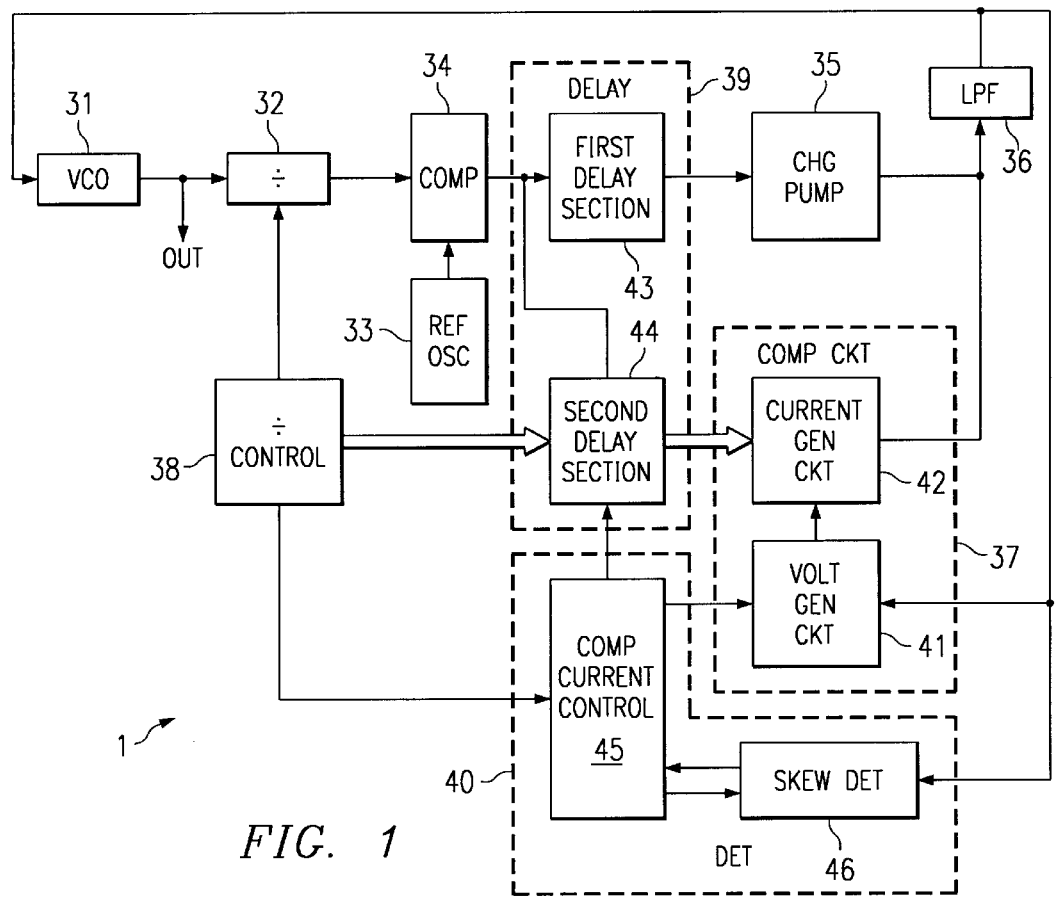
FIG. 1 is a block diagram showing a frequency synthesizer of the present invention.

Key 1 of FIG. 1 shows a frequency synthesizer of an embodiment of the present invention.

This frequency synthesizer 1 is provided in a semiconductor integrated circuit device that forms the transmission and reception circuit of a cellular telephone, and it has an oscillator 31, a frequency divider 32, a reference clock signal generator 33, a phase comparator 34, a charge pump circuit 35, a low-pass filter 36, a frequency divider control circuit 38, a compensating circuit 37, a delay circuit 39, and a detector circuit 40.

The oscillator 31 outputs an external output signal (OUT), and that external output signal (OUT) is output to the frequency divider 32 and to other circuits within the semiconductor integrated circuit device containing this frequency synthesizer 1.

The above-mentioned frequency divider 32 is controlled by means of a frequency divider control circuit 38 which is constructed so that the divisor value is cyclically changed, and it is made so as to generate a comparison signal by frequency dividing the external output signal (OUT) that is input according to the divisor value.

The frequency divider control circuit 38 is connected to the frequency divider 32 controlling the divisor ratio, and it is also connected to a current generating circuit 42 via a second delay section 44 that is explained later, and it stores the later explained compensating current value within the compensating voltage control data.

The reference clock signal generator 33 generates a reference clock signal of a prescribed frequency, and that reference clock signal and the above-mentioned comparison signal are input to the phase comparator 34.

The phase comparator 34 finds the phase difference by comparing the phase of the comparison signal and the phase of the reference clock signal, and it outputs a phase difference signal that supplies the phase difference to the charge pump circuit 35 via a first delay section 43 of the delay circuit 39.

The first delay section 43 delays the phase difference signal a prescribed length of time, and outputs the delayed signal to the charge pump circuit 35. Its detailed construction is explained later.

The charge pump circuit 35 supplies a fixed current for exactly a prescribed length of time according to the phase difference when a phase difference signal is input.

The low-pass filter 36 removes the high frequency component from the fixed current that is supplied from the charge pump circuit 35, and it outputs a control signal to the oscillator 31.

The oscillator 31, according to a control signal that is input, changes the frequency of the external output signal (OUT) in a direction that reduces the phase difference between the phase of the comparison signal and the phase of the reference clock signal.

The compensating circuit 37 includes the voltage generating circuit 41 and the current generating circuit 42. The output of the current generating circuit 42 is connected to the output of the charge pump circuit 35, and its input is connected to the voltage generating circuit 41.

The current generating circuit 42 has a plurality of capacitors and a DA converter that are not illustrated, and when the compensating voltage data stored in the frequency divider control circuit 38 are input, the data are DA converted at the DA converter and generate an analog voltage. This analog voltage is applied to the plurality of capacitors, and a compensating current of a size corresponding to the compensating voltage data is output.

The compensating voltage data form parallel data that are output from the frequency divider control circuit 38, and after being delayed a prescribed time by the second delay section 44, the data are supplied to the current generating circuit 42. The second delay section 44 is provided in the delay circuit 39, but the details of its construction are explained later.

Figure 5A:
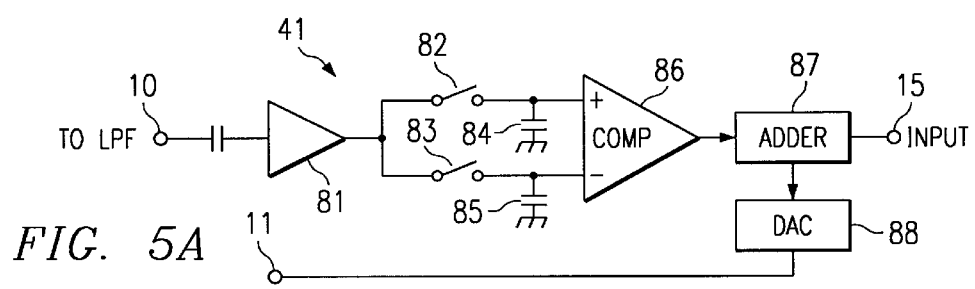
FIG. 5(a) is a diagram explaining the compensating current generating circuit of the present invention.

Digital data are prestored in the compensating current control circuit 45, and the digital data are input to the DA converter 88 (refer to FIG. 5(a)) of the voltage generating circuit 41. When the data are DA converted by the DA converter 88 and an analog voltage is generated, this analog voltage is used as the operating reference voltage for the DA converter within the current generating circuit 42.

The voltage generating circuit 41, as shown in FIG. 5(a), has an adder 87 and the DA converter 88. The input terminal 15 of the adder 87 is connected to the output of the compensating current control circuit 45.

In the frequency synthesizer 1 having the construction described above, a feedback loop is formed starting at the oscillator 31, proceeding through the frequency divider 32, the phase comparator 34, the first delay section 43, the charge pump circuit 35, and the low-pass filter 36, back to the oscillator 31.

When the frequency synthesizer 1 begins to operate in this configuration, the feedback loop performs a PLL operation. At first, the delay time at the first delay section 43 is made a minimum time. When this is done, the error between the phase of the comparison signal that is output from the frequency divider 32 and the phase of the reference clock signal becomes small, and by making this small error even smaller at the next operation, the error steadily becomes smaller compared to the operation starting time.

When the above-mentioned operation is repeated, it can be made so that the phase of the comparison signal and the phase of the reference clock signal are synchronized, and when both phases are almost synchronized, and the frequency of the external output signal (OUT) is synchronized to the frequency of the reference clock signal that is multiplied by the average divisor value, the PLL reaches a locked state.

In the interval from after the power is turned on until the PLL loop is locked, the digital data stored within the compensating current control circuit 45 are output to the adder 87 in the voltage generating circuit 41 via terminal 15 (refer to FIG. 5(a)), and a DA-converted analog voltage is generated by the DA converter 88. This analog voltage is input to a not illustrated DA converter within the current generating circuit 42, and the DA converter uses this analog voltage as an operating reference voltage.

On the other hand, when the compensating voltage data from the second delay section 44 are input to the current generating circuit 42, they are DA converted at a not illustrated DA converter within the current generating circuit 42, a compensating voltage is generated, and a compensating current of a size corresponding to this compensating voltage is superimposed on the output signal of the charge pump circuit 35.

At this time, the delay time at the second delay section 44 is set to the same time as the delay time of the first delay section 43, and it is made so that there is no time difference between the delays generated by the first and second delay sections 43, 44 between the output signal of the charge pump circuit 35 and the compensating current.

After the PLL loop is locked in this manner, in the frequency synthesizer 1 of the present invention, first, the current quantity of the compensating current is corrected so that the current quantity of the compensating current matches the current quantity of the ripple current that is actually generated.

The voltage generating circuit 41 of the present invention, as shown in FIG. 5(a), in addition to the above-mentioned adder 87 and DA converter 88, is equipped with an amplifier 81, a first switch 82, a second switch 83, a first capacitor 84, a second capacitor 85, and a comparator 86.

The amplifier 81 has an input terminal 10 connected to the output of the low-pass filter 36 and its output terminal connected to one end of the first and second capacitors 84, 85 via the first and second switches 82, 83, respectively. The amplifier amplifies the output signal of the low-pass filter 36, and the amplified output voltage is transferred to one end of the first and second capacitors 84, 85.

One end of the first and second capacitors 84, 85 is connected to the non-inverting input and the inverting input of the comparator 86, respectively, and the output of the comparator 86 is connected to the input of the adder 87.

In the above-mentioned voltage control circuit 41, the first and second switches 82, 83 are both placed in the OFF state until the PLL loop is locked. After the PLL loop is locked, the first switch 82 is turned ON at the time the ripple current becomes a minimum, and the first capacitor 84 is charged by the output voltage of the amplifier 81. The output voltage of the amplifier 81, at the time the ripple current becomes a minimum, is a voltage of a size corresponding to the output signal with the superimposed compensating current. This voltage becomes the voltage between both terminals of the first capacitor 84. After the charging is completed, the first switch 82 is turned OFF, and the voltage between both terminals of the first capacitor 84 is input to the non-inverting input + of the comparator 86.

Next, at the time the ripple current becomes a maximum, the second switch 83 is turned ON, and the second capacitor 85 is charged by the output voltage of the amplifier 81. The voltage between both terminals of the second capacitor 85, at the time the ripple current becomes a maximum, is a voltage of a size corresponding to the output signal with the superimposed compensating current. This voltage becomes the voltage between both terminals of the second capacitor 85. When the charging is completed, the second switch 83 is turned OFF, and the voltage between both terminals of the second capacitor 85 is input to the inverting input − of the comparator 86.

In this way, at the time the ripple current becomes a minimum, and at the time it becomes a maximum, a voltage of a size corresponding to an output signal with the superimposed compensating current is input to the comparator 86. The comparator 86 compares these voltages, and outputs the comparison results to the adder 87.

The adder 87, based on the comparison results, increases or reduces the desired digital data input from the compensating current control circuit 45, and increases or reduces the operating reference voltage for the DA converter within the current generating circuit 42.

Figure 2A:
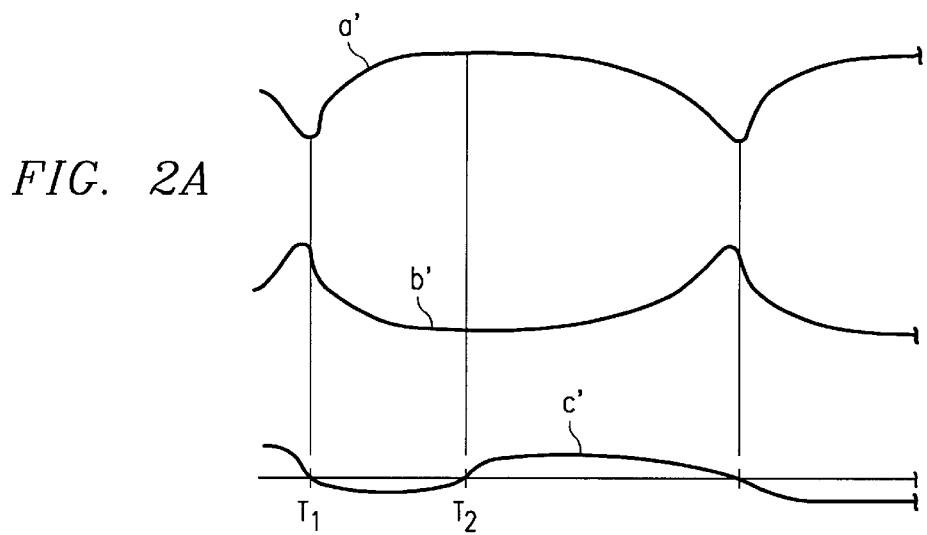
FIG. 2 consists of
  (a): a waveform chart explaining the relationship of the ripple current and the compensating current,
  (b): a waveform chart showing the ripple current with the superimposed compensating current, in a condition wherein the sizes of the ripple current and the compensating current match,
  (c): a waveform chart showing the ripple current with the superimposed compensating current after an operation that synchronizes the output timing of the ripple current and the compensating current, and
  (d): a waveform chart showing the ripple current with the superimposed compensating current, in a condition wherein the output timing of the ripple current and the compensating current are finally synchronized.

The waveform for the ripple current and the compensating current, respectively, are shown by the curves (a', b') in FIG. 2(a). In FIG. 2(a), the time ($t_1$) is the time at which the ripple current becomes a minimum, and the time ($t_2$) is the time at which the ripple current becomes a maximum.

An output signal with the superimposed compensating current is output, and when the voltage value at time ($t_2$) is larger than the voltage value at the time ($t_1$), since the compensating current is greater than the ripple current, the adder 87 decreases the prescribed digital data. The operating reference voltage of the DA converter of the current generating circuit 42 is decreased, and the compensating voltage decreases. Since the compensating current is also decreased due to the decreased compensating voltage, the error between the size of the ripple current and the size of the compensating current becomes small.

On the other hand, if the voltage value at time ($t_2$) is smaller than the voltage value at time ($t_1$), since the compensating current is smaller than the ripple current, the adder circuit 87 increases the prescribed digital data. When this is done, since the compensating current is increased due to the increased compensating voltage, the error between the size of the ripple current and the size of the compensating current becomes small.

In this way, at the times ($t_1$, $t_2$) at which the ripple current becomes a minimum and a maximum, the output voltage of the low-pass filter 36 is detected, these large and small relationships are compared, and when the compensating current is increased or decreased based on the comparison results, the error between the ripple current and the compensating current becomes small. By repeating this type of operation a number of times, the compensating current is corrected so that eventually the sizes of the compensating current and the ripple current become equal.

The waveform for the output signal with the superimposed compensating current in the condition in which the sizes of the compensating current and the ripple current are equalized in this manner is shown by curve (c') in FIG. 2. As shown by this curve (c'), the ripple current is not completely removed just by equalizing the sizes of the compensating current and the ripple current.

In the frequency synthesizer 1 of the present invention, as shown in FIG. 1, a ripple skew detector circuit 46 is provided, and after the size of the compensating current and the size of the ripple current are equalized, the ripple skew detector circuit 46 is activated.

Figure 5B:
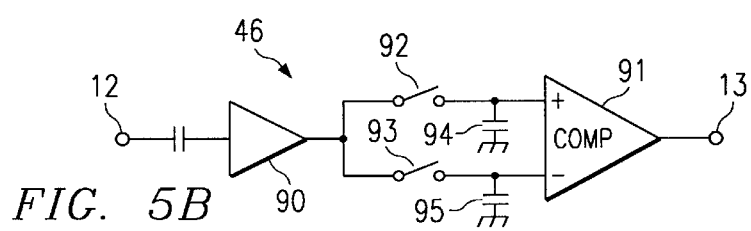
FIG. 5(b) is a diagram explaining the ripple skew detector circuit of the present invention.

The ripple skew detector circuit 46, as shown in FIG. 5(b), has an amplifier 90, a comparator 91, a third and fourth switch 92, 93, and a third and fourth capacitor 94, 95.

The amplifier 90 has an input terminal 12 connected to the output of the low-pass filter 36, and its output is connected to one end of the third and fourth capacitors 94, 95 via the third and fourth switch 92, 93, respectively. The amplifier amplifies the output signal of the low-pass filter 36, and charges the third and fourth capacitors 94, 95.

One end of the third and fourth capacitors 94, 95 is connected to the non-inverting input and the inverting input, respectively, of the comparator 91, and the output terminal 13 of the comparator 91 is connected to the compensating current control circuit 45. Also, the voltage between both terminals of the third and fourth capacitors 94, 95 are compared, and the comparison result is output to the compensation current control circuit 45.

In this type of ripple skew detection circuit 46, the PLL loop is locked, and until the size of the compensation current becomes equal to the size of the ripple current, both third and fourth switches 92, 93 are in the OFF state.

Figure 2B:
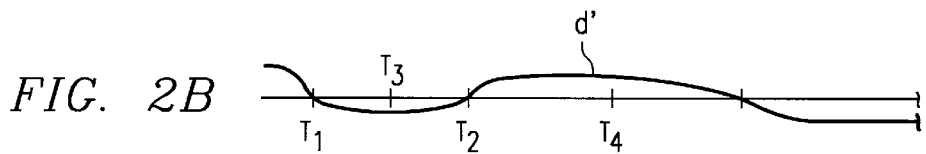
Figure 2C:
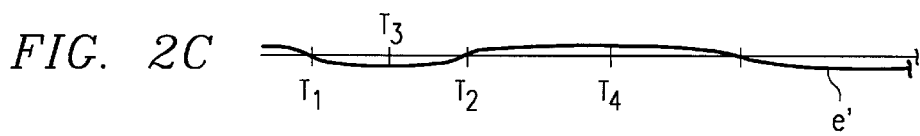
Figure 2D:
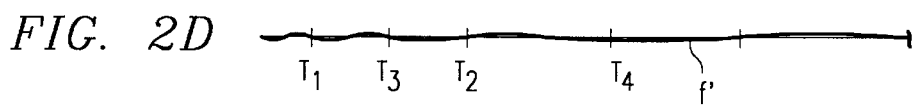
Figure 7:
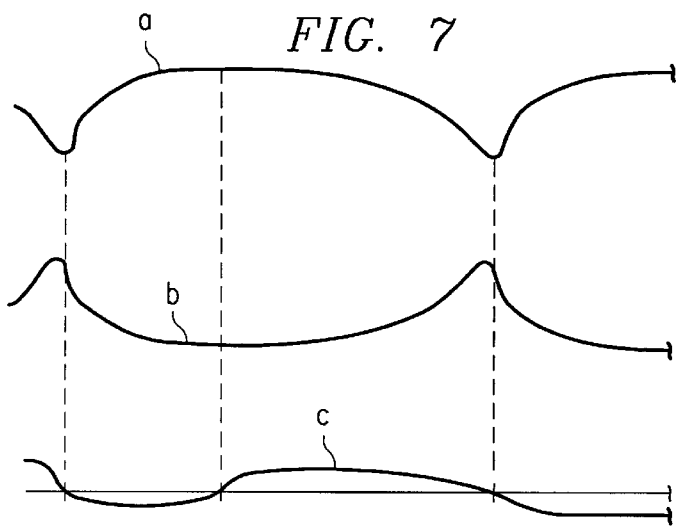
FIG. 7 is a waveform diagram explaining the conventional relationship of the ripple current and the compensating current.

The waveform of the ripple current with the superimposed compensating current is shown by key (d') of FIG. 2(b), after the size of the compensation current and the size of the ripple current have become equal. In the figure., the time ($t_3$) is the time before the time ($t_2$) when the ripple current is at a maximum, and the time ($t_4$) is the time after the time ($t_2$) when the ripple current is at a maximum.

After the size of the compensating current has become equal to the size of the ripple current, at time ($t_3$), the third switch 92 is turned ON, and the third capacitor 94 is charged by the output voltage of the amplifier 90. At this time, the output voltage of the amplifier 90, at time ($t_3$), is a voltage of a size corresponding to the output signal with the superimposed compensating current, and this voltage becomes the voltage between both terminals of the third capacitor 94.

The third capacitor 94 is charged by the output signal of the low-pass filter 36 that has been amplified. At time ($t_3$), the third capacitor 94 is charged by a voltage of a size corresponding to the output signal with the superimposed compensating current. When the charging has been completed, the third switch 92 is turned OFF. When this is done, the voltage between both terminals of the third capacitor 94 is input to the non-inverting input + of the comparator 91.

Next, at time ($t_4$) the fourth switch 93 is turned ON, and the fourth capacitor 95 is charged. At time ($t_4$), the fourth capacitor 95 is charged by a voltage of a size corresponding to the output signal with the superimposed compensating current. After the charging is completed, the fourth switch 93 is turned OFF. When this is done, the voltage between both terminals of the fourth capacitor 95 is input to the inverting input − of the comparator 91.

In this way, the output voltage of the low-pass filter 36 is detected at the times ($t_3$, $t_4$) before and after the time ($t_2$) at which the ripple current is a maximum, and these output voltages are compared at the comparator 91. The comparator 91 outputs the comparison results to the compensating current control circuit 45.

The compensating current control circuit 45 generates a delay control signal based on the comparison results of the comparator 91, and outputs the control signal to the first and second delay sections 43, 44 that are provided within the delay circuit 39.

Figure 3:
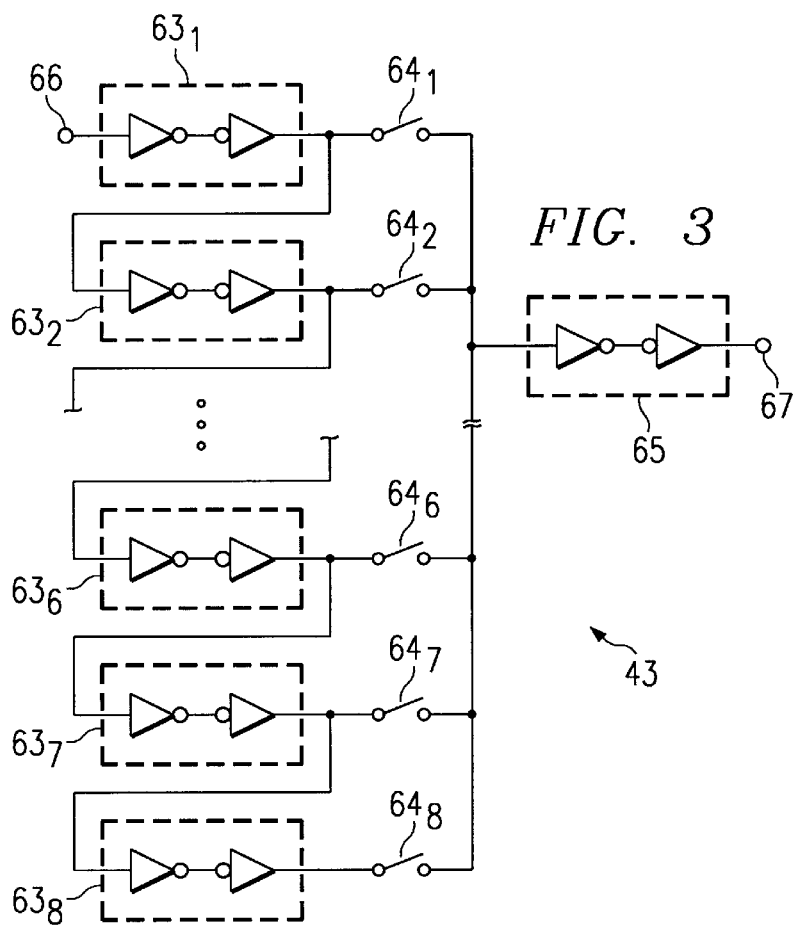
FIG. 3 is a block diagram explaining the first delay section of the present invention.
Figure 6:
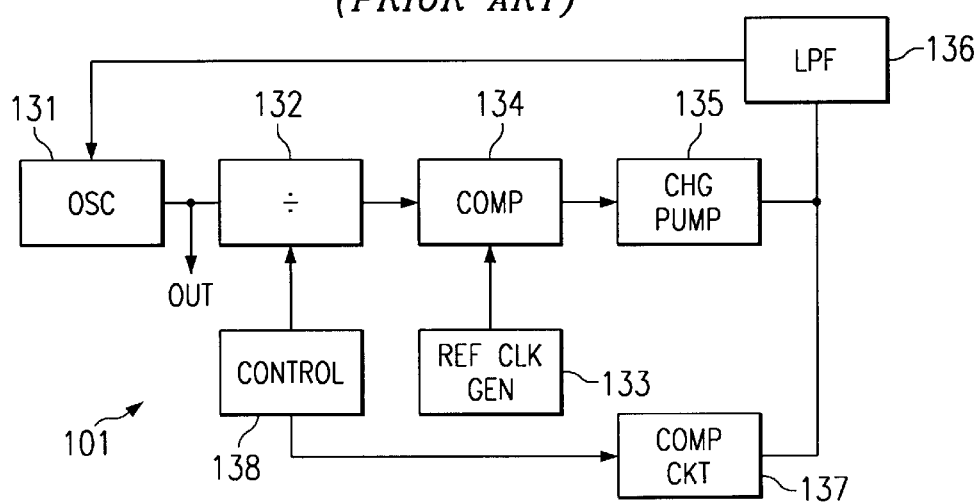
FIG. 6 is a block diagram showing a conventional frequency synthesizer.
Figure 4:
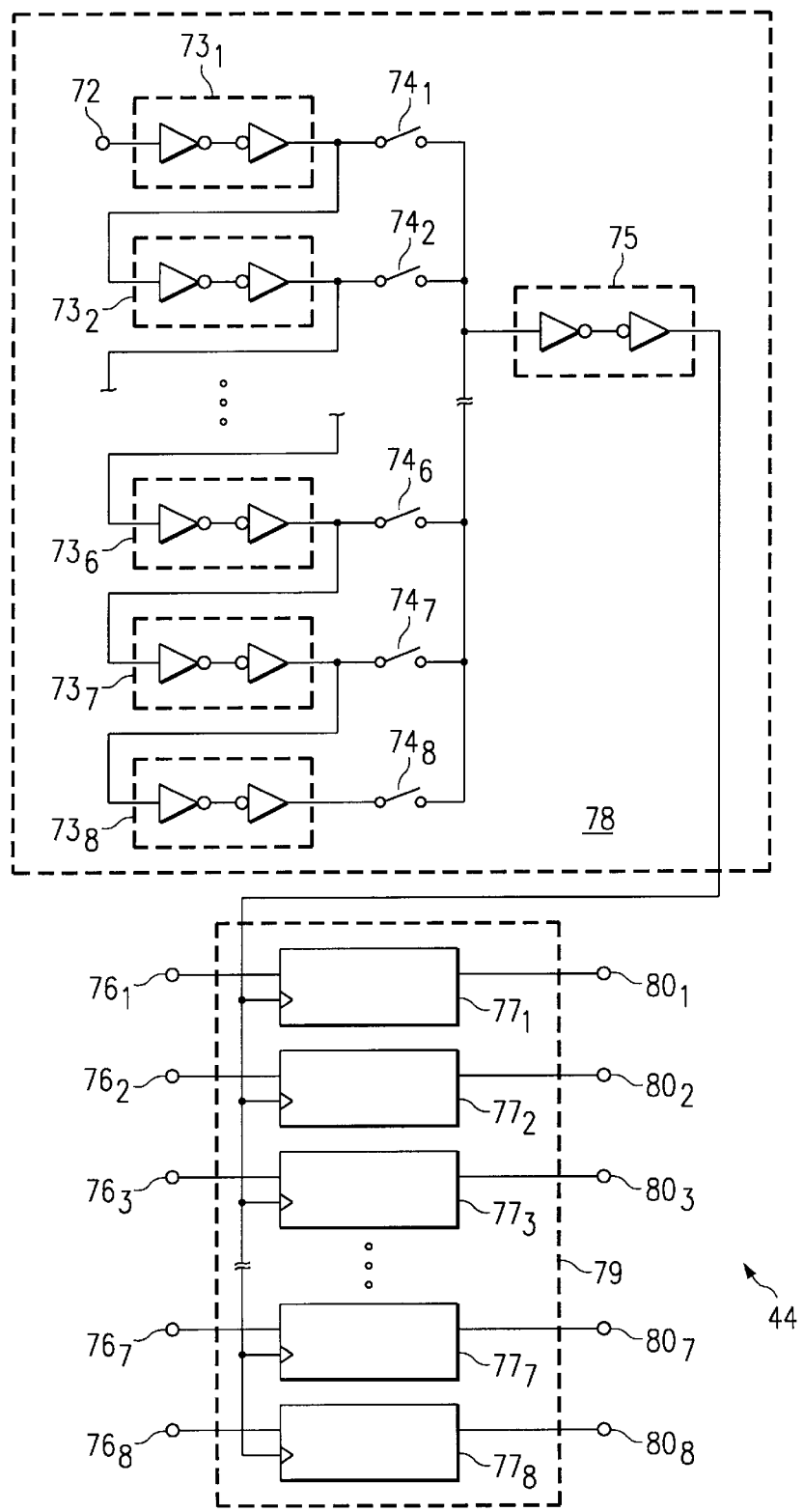
FIG. 4 is a block diagram explaining the second delay section of the present invention.

The construction of first and second delay sections 43, 44 are, shown in FIG. 3 and FIG. 4 respectively.

The first delay section 43, as shown in FIG. 3, has a plurality of delay elements $63_1$ to $63_8$, an output delay element 65, and a plurality of switch circuits $64_1$ to $64_8$. Here, it is assumed that the delay elements $63_1$ to $63_8$ and the switch circuits $64_1$ to $64_8$ have eight units, and the delay times of the delay elements $63_1$ to $63_8$ and the output delay element 65 are assumed to be equal.

The delay elements $63_1$ to $63_8$ are connected in series, and the input terminal of the first stage of the delay elements $63_1$ is connected to the output of the phase comparator 34. The output of each of the delay elements $63_1$ to $63_8$ is connected to the input of the output delay circuit 65 via the switch circuits $64_1$ to $64_8$, respectively, and the output terminal 67 of the output delay circuit 65 is connected to the input of the charge pump circuit 35. Also, it is constructed so that when a phase difference signal is input from the input terminal 66 of the delay element $63_1$, that phase difference signal is delayed at each delay element $63_1$ to $63_8$, input to the output delay element 65 via a switch $64_1$ to $64_8$, and after being delayed at the output delay element 65, the signal is output to the charge pump circuit 35.

The switch circuits $64_1$ to $64_8$ are constructed so that any one unit is turned ON based on the delay control signal, and by selecting the switch circuit $64_1$ to $64_8$ that is turned ON, a delay element $63_1$ to $63_8$ that is connected to the input of the output delay circuit 65 is selected, so that the delay time of the phase difference signal is adjusted.

For example, when only the switch circuit $64_7$ is turned ON, since the output of the seventh delay element $63_7$ is input to the output delay element 65, the total delay time of the first delay section 43 is equal to the delay time for the seven delay elements $63_1$ to $63_7$ and the delay time of the single output delay element 65, in other words, it is equal to a delay time of eight delay elements.

From this condition, if the seventh switch circuit $64_7$ is turned OFF, and the switch circuit $64_6$ of the preceding stage is turned ON, since the output of the sixth delay element $63_6$ is input to the output delay element 65, and the total delay time in this case is the total delay time for the six delay elements $63_1$ to $63_6$ and the delay time of the single output delay amount 65, in other words, it is equal to a delay time of seven delay elements. Because of this, the delay time is shorter than the case wherein the seventh switch circuit $64_7$ is turned ON.

Conversely from the condition in which they seventh switch circuit $64_7$ was turned on, if the switch circuit $64_7$ of the seventh stage is turned OFF, and the switch circuit $64_8$ of the final stage is turned on, since the output of the eighth delay element $63_8$ is input to the output delay element 65, the total delay time for this case is equal to the total delay time for the eight delay elements $63_1$ to $63_8$ and the delay time of the single output delay element 65, in other words, it is equal to a delay time for nine delay elements. Because of this, the delay time is longer than the case wherein the seventh switch circuit $64_7$ is turned ON.

In this way, in a condition wherein any one switch circuit 64 is turned ON, if only the switch 64 of a previous stage is turned ON, the delay time can be made shorter, and conversely, if only the switch circuit 64 of a following stage is turned ON, the delay time can be made longer. By means of controlling the switch circuit that is turned ON in this manner, the delay time can be adjusted.

On the other hand, the second delay section 44 shown in FIG. 4 has a delay section 78, and a data transfer section 79, and the data transfer section 79 has a plurality of data holding circuits $77_1$ to $77_8$.

The input terminal 72 of the delay section 78 is connected to the output of the phase comparator 34, and the input terminals $76_1$ to $76_8$ of the data transfer section 79 are connected to the output of the frequency divider control circuit 38, and the output terminals $80_1$ to $80_8$ are connected to the input of the current generating circuit 42, respectively.

The delay section 78, in the same manner as the first delay section 43, has series-connected delay elements $73_1$ to $73_8$, switch circuits $74_1$ to $74_8$ that are respectively provided at the outputs of the delay elements, and an output delay element 75, and is constructed so as to output data to each data holding circuit $77_1$ to $77_8$ based on the delay control signal, after the phase difference signal is delayed a prescribed time.

Also, each data holding circuit $77_1$ to $77_8$ temporarily holds each bit of parallel data from the data input terminals $76_1$ to $76_8$, and they are constructed so as to, when a phase difference signal that has been delayed a prescribed time by the delay section 78 is input to each data holding circuit $77_1$ to $77_8$, output each bit of parallel data all at once to the current generating circuit 42. Therefore, the second delay section 44, based on a delay control signal, turns ON any one of the switch circuits $74_1$ to $74_8$, and in the same manner as the first delay section 43, can adjust the delay time for each bit of the parallel data. In this way, the first and second delay sections 43, 44 are constructed so as to adjust the respective delay times based on a delay control signal.

If the output voltage of the low-pass filter 36 at the time $t_3$ in FIG. 2$b$ is made smaller than the output voltage of the low-pass filter at the time $t_4$, the compensating current is delayed more than the ripple current, and if the output voltage of the low-pass filter 36 at the time $t_3$ is made larger than the output voltage of the low-pass filter 36 at the time $(t_4)$, the compensating current is advanced more than the ripple current.

In a condition in which the PLL loop is locked, and the sizes of the compensating current and the ripple current are equal, at the first and second delay sections 43, 44, the switch circuits $64_1$, $74_1$ of the very first stages are turned ON so that the delay elements $63_1$, $73_1$, respectively, are connected, thus their respective delay times are set to a minimum.

As shown by the curve (d') in FIG. 2($b$), when the output at time ($t_3$) is smaller than the output at time ($t_4$), the compensating current is delayed more than the ripple current. In this case, based on the delay control signal that is output from the compensating current control circuit 45, in the first delay section 43, the switch circuit $64_2$ of the next stage after the switch circuit $64_1$ of the first stage is turned ON, the delay time of the phase difference signal that is output from the phase comparator 34 is increased by just the amount of delay for a single delay element $63_2$, and the ripple current can be delayed.

The waveform of the output signal with the superimposed compensating current after the above-mentioned ripple current is delayed is shown by curve (e') in FIG. 2($c$). The time difference between the output time of the compensating current and the output time of the ripple current becomes small, and it can be seen that the amplitude of the curve (e') becomes small compared to the amplitude of the curve (d') in FIG. 2($b$).

On the other hand, if the compensating current is ahead of the ripple current, based on the delay control signal, the second delay section 44 turns on the switch circuit $74_2$ of the stage following the switch circuit $74_1$ of the first stage, and the delay time for the phase difference signal that is output from the phase comparator 34 is increased exactly by the delay time for one delay element $73_2$. When this is done, since the delay time of the compensating voltage data that is output from the frequency divider control circuit 38 increases, the delay time for the compensating current is increased, and the compensating current can be delayed. Also, since the compensating current that had been ahead is delayed, the time difference between the output time for the compensating current and the output time for the ripple current can be made small.

As described above, by delaying the ripple current or the compensating current according to the detection results for the output signal with the superimposed compensating current at time ($t_3$) and time ($t_4$), the output time for the compensating current and the ripple current can be corrected so that the time difference for the output times is made small.

When the output time for the compensating current and the ripple current are corrected in this manner, at both times ($t_3$, $t_4$), an output signal with the superimposed compensating current is detected, and the delay circuit 39 delays one or both of the ripple current and the compensating current in response to those detection results. Based on those detection results, the time difference between the output times is re-corrected. This type of operation is repeated a number of times, the time difference between the output times is steadily made smaller, and it is made so that the output time for the compensating current and the output time for the ripple current are synchronized, so that the size of the output signal with the superimposed compensating current becomes the same at times ($t_3$, $t_4$).

After that, the output signal of the voltage generating circuit 41 with the superimposed compensating current is again detected at times ($t_1$, $t_2$), the current quantity of the compensating current is again corrected based on those detection results, and when the output signal with the superimposed compensating current is the same at times ($t_1$, $t_2$), finally, the output time for the compensating current and the output time for the ripple current are synchronized, and as shown by curve (f') in FIG. 2($d$), since the output signal with the superimposed compensating current has become almost zero, the ripple current can be removed accurately.

In this way, a compensating current can be obtained so that the output signal with the superimposed compensating current becomes almost zero, and after that, the compensating circuit 37 continuously outputs this compensating current, and the frequency synthesizer 1 shifts to a normal PLL operation.

In this embodiment, the presence or absence of a time difference between the output time of the ripple current and the output time of the compensating current is detected by detecting the output voltage of the low-pass filter (36) a total of two times at the times ($t_3$, $t_4$), but the present invention is not limited to this.

Also, it is constructed so that, after the output voltage of the low-pass filter 36 is detected, the delay times at the first and second delay sections 43, 44 are changed by turning ON a switch circuit of an earlier stage or a later stage than the switch circuit that is currently ON from among the switch circuits $64_1$ to $64_8$, $74_1$ to $74_8$, respectively, so that the delay time can be increased or decreased by one delay element, but the present invention is not limited to this, and for example, the switch circuit that is turned on can be changed; by multiple stages in response to the output voltage that is detected, so as to be able to increase or decrease the delay time by several delay elements.

Furthermore, in this embodiment, if the compensating current is ahead of the ripple current, the delay time at the second delay section 44 is increased, and control is performed so that the time difference between the output time of the ripple current and the output time of the compensating current is made small by increasing the delay time of the one ahead of the other, so as to increase the delay time of the compensating current, but the present invention is not limited to this, and there can also be control so as to make the time difference small between the output time of the ripple current and the output time of the compensating current by reducing the delay time of the one that is lagging. As one example, in a case wherein the compensating current is ahead of the ripple current, the delay time of the ripple current can be reduced by reducing the delay time to the first delay section 43.

In a condition wherein the output time for the compensating current and the output time for the ripple current are synchronized at the time of superimposing the compensating current on the ripple current, since the compensating current is superimposed on the ripple current, the ripple current can be removed accurately.

What is claimed is:

1. A frequency synthesizer comprising:
   an oscillator that controls the frequency of an output signal according to a voltage control signal,
   a frequency divider that divides the output signal according to a frequency division value that changes cyclically and generates a comparison signal,
   a phase comparator that generates a phase difference signal by comparing a phase of the comparison signal and a phase of a reference clock signal,
   a delay circuit that generates and applies a delay to the phase difference signal,
   a charge pump circuit that generates a control signal corresponding to the phase difference signal that is output from the delay circuit,
   a low-pass filter that executes a prescribed wave filtering process on the control signal and outputs a voltage control signal,
   a compensating circuit that superimposes a compensating current on the control signal according to compensation voltage data,
   a detecting circuit that detects output time of the control signal from the voltage control signal and output time of the compensating current, and outputs a detection signal,
   wherein the delay circuit controls the supply of the compensation voltage data to the compensating circuit so that the output time of the control signal and the output time of the compensating current are synchronized.

2. Frequency synthesizer claimed in claim 1 wherein the detecting circuit, within one cycle of the cyclic frequency divider detects time difference between the output time of the control signal and the output time of the compensating current by means of the voltage control signal that contains the superimposed compensating current and that is output at two times that bracket times when the ripple current is at a maximum and a minimum.

3. In a frequency synthesizer having a PLL and a compensatory circuit for compensating for ripple introduced by having a variable divide ratio in said PLL, the improvement comprising:
   a delay circuit coupled to an output of a phase comparator in said PLL; and
   a delay circuit coupled to an output of said compensatory circuit, whereby the output of said phase comparator and the output of said compensatory circuit are synchronized.

4. A method of compensating for ripple produced in an output of a frequency synthesizer caused by having a variable divide ratio in a PLL, the method comprising:
   delaying an output of a phase comparator in said PLL;
   delaying an output of a ripple compensation circuit; and
   controlling the delay to at least one of said output of said phase comparator and compensation circuit, whereby said output of said phase comparator and said output of said ripple compensation circuit are synchronized.

* * * * *